(12) United States Patent
Chen et al.

(10) Patent No.: US 11,158,772 B2
(45) Date of Patent: Oct. 26, 2021

(54) LIGHTING ASSEMBLY AND METHOD FOR MANUFACTURING A LIGHTING ASSEMBLY

(71) Applicant: Lumileds LLC, San Jose, CA (US)

(72) Inventors: Nan Chen, Winchester, MA (US); Hiu Tung Chu, Kowloon (HK); Dong Pan, Shanghai (CN); Paul Scott Martin, Livermore, CA (US); Tomonari Ishikawa, Saitama (JP)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/302,498

(22) PCT Filed: May 16, 2017

(86) PCT No.: PCT/EP2017/061709
§ 371 (c)(1),
(2) Date: Nov. 16, 2018

(87) PCT Pub. No.: WO2017/198654
PCT Pub. Date: Nov. 23, 2017

(65) Prior Publication Data
US 2019/0280171 A1 Sep. 12, 2019

(30) Foreign Application Priority Data

May 18, 2016 (WO) ................. PCT/CN2016/082467
Jun. 17, 2016 (EP) ...................................... 16174915

(51) Int. Cl.
*H01L 33/56* (2010.01)
*H01L 33/58* (2010.01)
(Continued)

(52) U.S. Cl.
CPC .............. *H01L 33/56* (2013.01); *F21K 9/235* (2016.08); *H01L 23/28* (2013.01); *H01L 23/52* (2013.01); *H01L 33/58* (2013.01); *H01L 33/62* (2013.01)

(58) Field of Classification Search
CPC .................... H01L 23/49568; H01L 2924/069
See application file for complete search history.

(56) References Cited

U.S. PATENT DOCUMENTS

| 7,329,617 B2 | 2/2008 | Li et al. | |
| 8,120,153 B1 * | 2/2012 | Shen | H01L 21/565 257/677 |

(Continued)

FOREIGN PATENT DOCUMENTS

| CN | 103923322 A | 7/2014 |
| CN | 104064656 A | 9/2014 |

(Continued)

OTHER PUBLICATIONS

European Search Report dated Dec. 21, 2018 for European Patent Application No. EP 16174915.
(Continued)

*Primary Examiner* — Moazzam Hossain
(74) *Attorney, Agent, or Firm* — Volpe Koenig

(57) ABSTRACT

A lighting assembly is disclosed which includes a leadframe and at least one light-emitting diode (LED) element arranged on the leadframe. At least a portion of the leadframe is covered with a polyurethane coating arranged to electrically insulate the portion of the leadframe, and at least a portion of the polyurethane covered portion of the leadframe is further covered with a thermally conductive material. A method for manufacturing the lighting assembly is also disclosed.

5 Claims, 3 Drawing Sheets

(51) Int. Cl.
*H01L 23/28* (2006.01)
*H01L 23/52* (2006.01)
*F21K 9/235* (2016.01)
*H01L 33/62* (2010.01)

(56) References Cited

U.S. PATENT DOCUMENTS

| | | | |
|---|---|---|---|
| 8,581,393 B2 | 11/2013 | Meis et al. | |
| 9,276,179 B2 | 3/2016 | Takenaka et al. | |
| 2011/0220927 A1* | 9/2011 | Min | H01L 33/647 257/91 |
| 2012/0007111 A1* | 1/2012 | Lee | H01L 33/642 257/88 |
| 2013/0256854 A1* | 10/2013 | Kobayashi | H01L 23/49568 257/675 |
| 2015/0108531 A1* | 4/2015 | Schwarz | H01L 23/49568 257/99 |

FOREIGN PATENT DOCUMENTS

| | | |
|---|---|---|
| JP | 06-244340 A | 9/1994 |
| JP | 07-96537 A | 4/1995 |
| JP | 2006-182904 A | 7/2006 |
| JP | 2007-158209 A | 6/2007 |
| JP | 2007-148534 A | 7/2007 |
| JP | 2011-040715 A | 2/2011 |
| WO | 2014/115064 A1 | 7/2014 |
| WO | 2015091462 A1 | 6/2015 |
| WO | 2016/024735 A1 | 2/2016 |

OTHER PUBLICATIONS

International Preliminary Report on Patentability Chapter I dated Nov. 20, 2018 for PCT International Application No. PCT/EP2017/061709.

International Search Report dated Jun. 8, 2017 for PCT International Application No. PCT/EP2017/061709.

* cited by examiner

LIGHTING ASSEMBLY AND METHOD FOR MANUFACTURING A LIGHTING ASSEMBLY

FIELD OF THE INVENTION

The present invention generally relates to the field of lighting equipment, and specifically to a lighting assembly having a leadframe provided with an electrically insulating coating and a thermally conductive material, and to a method for manufacturing such an assembly.

BACKGROUND

Lighting assemblies comprising light emitting diode (LED) elements have found wide applications, for example, in automotive lights. In the automotive lights, especially in high flux applications like headlights, the heat dissipation capability is of great importance.

WO 2014/115064 A1 discloses a lighting assembly wherein an LED element is arranged on a leadframe. The leadframe is provided with an optically reflective and electrically insulating material arranged to reflect light emitted from the LED element and to electrically insulate the leadframe.

WO 2013/091462 A1 discloses an LED bulb which comprises a leadframe and a high thermal conductivity plastic molded around the leadframe. The leadframe is coated with a dielectric layer, such as Teflon, silicone, oxide, or nitride, in places where the plastic will contact the leadframe. The use of electrically insulating material allows for molding a high thermally conductive material, which is typically also electrically conductive, over the leadframe for encapsulation and for heat dissipation.

Although such an LED bulb may provide a high operating performance, there is still a need for lighting assemblies with improved functionality and also methods for facilitating manufacturing of such lighting assemblies.

SUMMARY OF THE INVENTION

It has been found that it is not easy for a common electrically insulating or dielectric material, such as Teflon, to form a uniform coating on the leadframe with a complicated three-dimensional structure. In some instances, sharp areas, such as corners and embossments, of the leadframe will not even be fully covered by the electrically insulating material, which may then cause undesirable consequences, such as a short circuit.

The inventors have recognized with experiments that polyurethane is a suitable electrically insulating material for the leadframe due to, inter alia, its electrical insulation and adhesion properties. In particular, improved coverage of a uniform polyurethane coating on the leadframe is made possible by using a plasma-enhanced multi-cycle coating process.

It would therefore be advantageous to achieve a lighting assembly having a leadframe provided with a polyurethane coating. It would also be desirable to provide a method for manufacturing such an assembly.

According to a first aspect of the present invention, there is provided a lighting assembly which comprises a leadframe and at least one light-emitting diode (LED) element arranged on the leadframe. The at least one LED element is configured to emit light when supplied with electrical power by means of the leadframe. At least a portion of the leadframe is covered with a polyurethane coating arranged to electrically insulate the portion of the leadframe, and at least a portion of the polyurethane covered portion of the leadframe is further covered with a thermally conductive material.

The polyurethane coating provides the leadframe with the desired electrical insulation at an acceptable degree of uniformity and completeness of coverage, also for complicated leadframe structures. This allows for use of both thermally and electrically conductive material to cover the leadframe so as to improve the heat dissipation of the lighting assembly. The thermally conductive material in some embodiments may have an in-plane thermal conductivity larger than or equal to 1 W/mK.

The term "in-plane thermal conductivity" is used herein, as opposed to "through-panel thermal conductivity", to refer to the property of a material's ability to conduct heat in a direction in the plane of the material (i.e. the in-plane direction).

In some embodiments, the polyurethane coating may cover an entire surface of the leadframe other than an area where the leadframe receives the electrical power therethrough. This area of the leadframe is connected to or forms an electrical connector for receiving the electrical power from a power source. This provides the leadframe with a substantially complete electrical insulation, together with necessary electrical connectivity.

In some embodiments, the thermally conductive material may cover an entire surface of the polyurethane coating other than an area where the at least one LED element is arranged. In this way, the lighting assembly is provided with a maximum capability of heat dissipation without affecting the light output by the LED element.

According to a second aspect of the present invention, there is provided a method for manufacturing a lighting assembly, wherein a leadframe is provided and at least one light-emitting diode (LED) element is arranged on the leadframe. The at least one LED element is configured to emit light when supplied with electrical power by means of the leadframe. Further, at least a portion of the leadframe is covered with a polyurethane coating arranged to electrically insulate the portion of the leadframe, and at least a portion of the polyurethane covered portion of the leadframe is covered with a thermally conductive material.

In some embodiments, the polyurethane coating may be formed on the leadframe by applying a coating process comprising multiple cycles. The coating process may be selected from the group consisting of dipping, spraying, and brushing. The multi-cycle coating is advantageous in that it enables a relatively uniform polyurethane coating to be formed on the leadframe even when the leadframe has a complicated three-dimensional structure that is provided with for example a number of flanges or corners.

In some embodiments, in each cycle of the multi-cycle dipping, the leadframe is dipped into a polyurethane solution at room temperature for a first time period, then air-dried at room temperature for a second time period, and then cured at a constant temperature, e.g., in an oven, for a third time period. After the step of curing, the leadframe may be cooled at a progressively decreased temperature, e.g., in the oven where the leadframe is cured, rather than in the open air.

As compared with one-shot coating, the multi-cycle coating process allows for progressively forming of the polyurethane coating in multiple phases and thus results in a relatively uniform thickness of the coating.

In some embodiments, the method may further comprise a step of performing a plasma pre-treatment of the leadframe prior to applying the multi-cycle coating process, such that undesirable substances can be removed from the surface of the leadframe. Advantageously, the plasma pre-treatment is performed at an atmospheric pressure (known as open-air plasma) and it may have an ability of treating selected areas. The pre-treatment with atmospheric plasma makes it possible to immediately continue coating the leadframe, without the need of using a dedicated vacuum chamber for plasma cleaning.

These and other aspects of the present invention will be apparent from and elucidated with reference to the embodiments described hereinafter.

BRIEF DESCRIPTION OF THE DRAWINGS

Further details, features and advantages of the invention are disclosed in the following description of exemplary embodiments in connection with the accompanying drawings, in which.

DETAILED DESCRIPTION

Figure 1A:
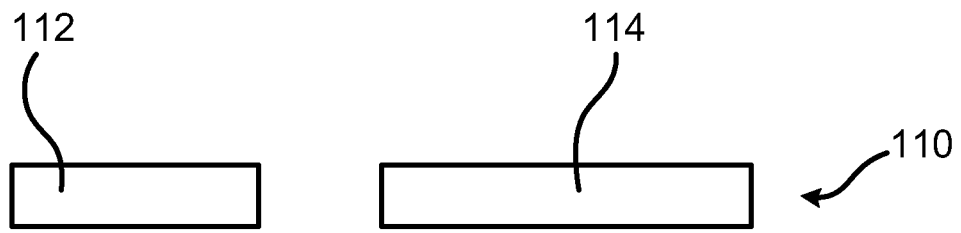
FIGS. 1a-1d illustrate a general outline of a method for manufacturing a lighting assembly according to an embodiment of the present invention.

The invention will now be described more fully hereinafter with reference to the accompanying drawings, in which exemplary embodiments of the invention are shown. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. Like reference numerals refer to like elements throughout.

In the context of the present application, the term "LED element" is used to denote any device or element that is capable of emitting radiation in any region or combination of regions of the electromagnetic spectrum, for example the visible region, the infrared region, and/or the ultraviolet region, when activated e.g. by applying a potential difference across it or passing a current through it. Therefore an LED element can have monochromatic, quasi-monochromatic, polychromatic or broadband spectral emission characteristics. Each LED element has at least one light source. Examples of light sources include semiconductor, organic, or polymer/polymeric LEDs, blue LEDs, optically pumped phosphor coated LEDs, optically pumped nanocrystal LEDs or any other similar devices as would be readily understood by a person skilled in the art. Furthermore, the term LED element can be used to define a combination of the specific light source that emits the radiation in combination with a housing or package within which the specific light source or light sources are placed. For example, the term LED element may refer to a bare LED die arranged in a housing, which may be referred to as an LED package. The LED element may also be domed, i.e. provided with e.g. a diffusing and/or lens shaped, light directing material.

FIGS. 1a-1d illustrate a general outline of a method for manufacturing a lighting assembly 100 according to an embodiment of the present invention.

The method comprises providing a leadframe 110. The leadframe 110 may for example comprise a first portion 112 and a second portion 114 of a sheet material that are not directly electrically connected (FIG. 1a). The leadframe 110 is used to provide mechanical mounting, electrical connection and heat dissipation for the LED element that is to be arranged thereon. To this end, the sheet material may for example comprise a metal such as copper or an alloy comprising copper and a plating applied thereon, which plating for example may be made of tin, nickel, gold, silver, or aluminum or an alloy comprising at least one of these metals.

Although not shown, the leadframe 110 may be bent or shaped such that it conforms to any desired shape, including complicated three-dimensional shapes, to meet an actual need.

Figure 1B:
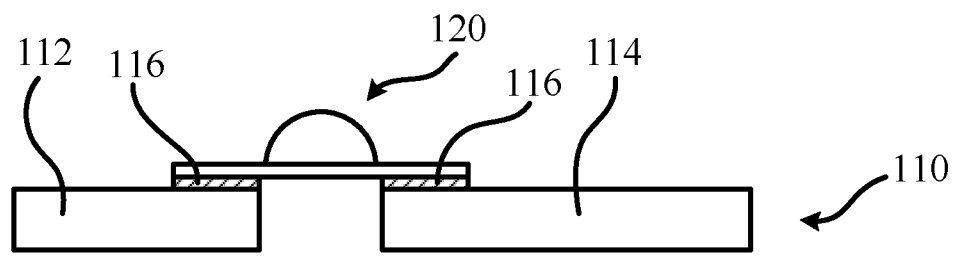

Referring to FIG. 1b, at the next step, at least one LED element 120 is arranged on the leadframe 110. As is shown, an electrical connection 116 is provided between the first and the second portion 112, 114 of the leadframe 110 and a first and a second portion of the LED element 120, respectively. In an embodiment, the LED element 120 is mechanically fixed to the leadframe 110 for example by soldering, electrically conductive gluing, welding, or clinching.

In the example of FIG. 1b, the first portion 112 of the leadframe 110 may be electrically connected to a ground terminal of a power source (not shown), and the second portion 114 of the leadframe 110 may be electrically connected to a positive terminal of the power source. This way, the LED element 120 is supplied with electrical power from the power source by means of the leadframe 110, and thus is enabled to emit light.

Figure 1C:
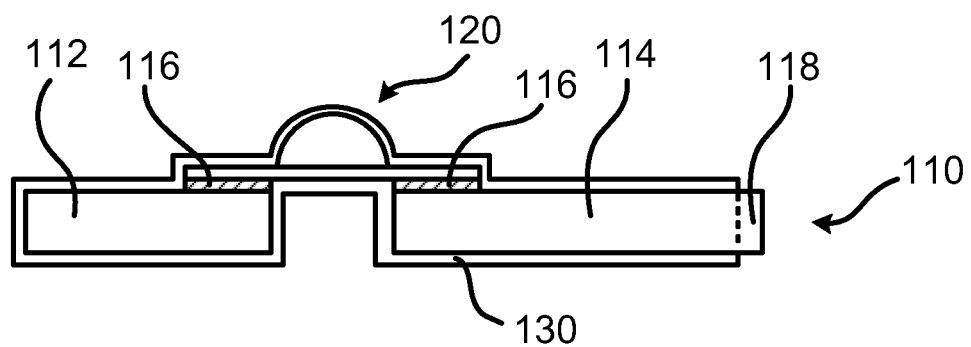

Now referring to FIG. 1c, after the arranging of the LED element 120, at least a portion of the leadframe 110 is covered with a polyurethane coating 130. In some embodiments, a multi-cycle coating process may be applied to form the polyurethane coating 130, as will be described later.

The polyurethane coating 130 provides electrical insulation for the leadframe 110 which now has the LED element 120 arranged thereon. This is advantageous in that electrical connections 116 between the leadframe 110 and the LED element 120, such as the solder joints, may be encapsulated, and thus protected, by the polyurethane coating 130. Furthermore, the polyurethane material would advantageously not reduce the light output efficiency of the LED element 120 due to its light-transmitting properties.

It may thus be desirable to cover the whole leadframe 110 with the polyurethane coating 130. In practice, an entire surface of the leadframe 110 other than an area 118 through which the leadframe 110 receives the electrical power from the power source, may be covered with the polyurethane coating 130. The area 118 is typically an end portion of the leadframe 110, which is reserved for electrical connection to the power source and thus should not be insulated by the polyurethane coating 130. It will be understood that although only one area 118 is shown in FIG. 1c, there may be two or more such areas reserved for electrical connection.

In an embodiment, the area 118 of the leadframe 110 is electrically connected, for example by wires, to an electrical connector for coupling to the power source. Alternatively, the area 118 may itself form the electrical connector. In either case, the leadframe 110 is provided with a substantially complete electrical insulation, together with necessary electrical connectivity.

Figure 1D:
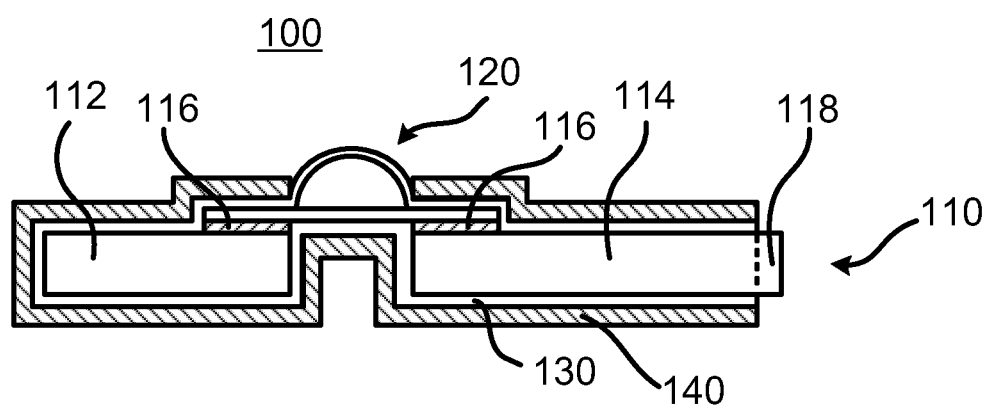

Then, with reference to FIG. 1d, at least a portion of the polyurethane-coated portion of the leadframe 110 is further covered with a thermally conductive material 140. This may be done by molding the thermally conductive material 140 on top of the polyurethane coating 130 under a high pressure, e.g. up to 600 bar, and high temperature, e.g. up to 320° C. This process is generally referred to as "overmolding". The overmolding material 140 provides the leadframe 110 with further encapsulation and especially transfers the heat conducted by the leadframe 110 to the ambient air. Moreover, the overmolding material 140 also provides the lighting assembly with a certain shape that can fit into a particular application such as an automotive light. The resulting lighting assembly 100 is shown in FIG. 1d.

Covering of the leadframe 110 with the electrically insulating polyurethane coating 130 allows for the use of more thermally conductive materials other than just dielectric materials with low thermal conductivity for overmolding. The thermally conductive material 140 may for example be a thermo-plastic material like polycaprolactam or Nylon 6, which can be loaded with electrically conductive materials such as metal particles for increase of the thermal conductivity. In an embodiment, the thermally conductive material 140 may have an in-plane thermal conductivity larger than or equal to 1 W/mK.

For better heat dissipation, the thermally conductive material 140 may cover an entire surface of the polyurethane coating 130 other than an area where the at least one LED element 120 is arranged, as shown in FIG. 1d. In this way, the resulting lighting assembly 100 is provided with a maximum capability of heat dissipation without affecting the light output by the LED element 120.

The foregoing is the general outline of the method for manufacturing the lighting assembly. Now details of the coating process of the polyurethane material used in the method will be described below in connection with FIG. 2.

Figure 2:
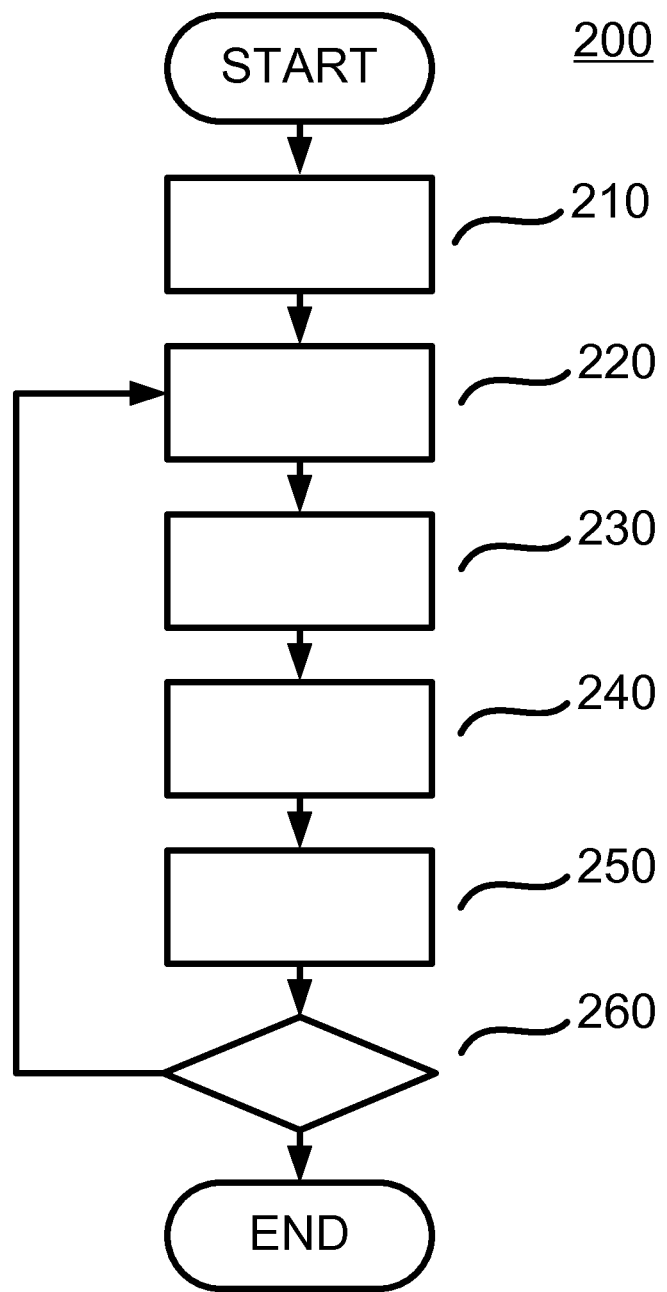
FIG. 2 is a flow chart of a multi-cycle coating process of a method for manufacturing a lighting assembly according to an embodiment of the present invention.

FIG. 2 shows a flow chart of a plasma-enhanced multi-cycle coating process 200 of the method for manufacturing the lighting assembly 100 according to an embodiment of the present invention.

At step 210, the leadframe 110 is subjected to plasma pre-treatment, wherein the surface of the leadframe 110 is cleaned by the plasma for a lower surface tension. In an example, the water contact angle of the leadframe surface can be lowered from >30° to <10°. Thereby a more uniformly attached coating may be made possible.

Preferably, prior to the plasma cleaning, organic solvents such as acetone or isopropyl alcohol may be used to clean the organic contaminants on the leadframe surface. Then, the plasma cleaning is performed at an atmospheric pressure without using a dedicated vacuum chamber. This provides a fast and cost-effective pre-treatment.

After the plasma treatment, the leadframe 110 may be checked by means of both visible examination and I-V measurement to make sure no damage or discoloration was caused by the plasma treatment.

At step 220, the leadframe 110 is dipped into a polyurethane solution at room temperature for a first time period. The first time period may be between 1 and 10 seconds, for example 1 second in an embodiment.

The polyurethane solution may be obtained by using a commercially available polyurethane coating such as HumiSeal Type 1A27 provided by HumiSeal®. Depending on the complexity and configuration of the leadframe 110, it may be necessary to reduce the viscosity of HumiSeal Type 1A27 with a thinner such as HumiSeal Thinner 521 to obtain a uniform film.

As previously described, the area of the leadframe 110 through which the electrical power is received will be reserved for electrical connection to the power source, and thus will not be coated with the polyurethane coating 130. This may be done by clamping this reserved area with a clamping fixture and then dipping the remaining portion of the leadframe 110 into the polyurethane solution.

At step 230, the dipped leadframe 110 is air-dried at room temperature for a second time period. The second time period may be between 10 and 120 minutes, for example 10 minutes in an embodiment.

At step 240, the air-dried leadframe 110 is cured at a constant temperature for a third time period. Typically, the curing is performed in an oven which provides the required constant temperature. The third time period may be between 30 and 240 minutes, for example 30 minutes in an embodiment, and the constant temperature may be in a range of 60 to 150° C., for example 100° C. in an embodiment.

At step 250, after the curing, the leadframe 110 is cooled at a progressively decreased temperature, for example in the oven where it is cured. The temperature of the oven may be controlled such that a cooling rate of 0.5 to 10° C. per minute is achieved in an embodiment.

At step 260, if a predetermined number of coating cycles have been performed, the coating process ends; otherwise, the procedure proceeds back to step 220, and then another coating cycle is repeated. The predetermined number of coating cycles may be set as a function of a required thickness of the resultant coating. The resultant coating may have an average thickness on the order of microns or even less, such as 0.1 µm.

In addition to the improved uniformity, another by-product of the multi-cycle coating process is that pin-holes can be reduced. Advantageously, a substantially 100% coverage of the polyurethane coating on the leadframe (except for the area reserved for electrical connection to the power source) is made possible by the improved uniformity and reduced pin-holes since even corners or sharp edges of the leadframe can now be covered with the polyurethane layer.

Although the coating process 200 has been described with respect to a dip-coating step (i.e., step 220), the coating process 200 may, in other embodiments, be performed by spraying or brushing.

In an embodiment where the spraying process is applied, continuing with the example of HumiSeal Type 1A27, step 220 may be performed by using a conventional spraying equipment to spray the 1A27 solution onto the surface of the leadframe 110. As a rule, the addition of a thinner such as Thinner 521 is necessary to assure a uniform spray pattern resulting in a pin-hole free film. The amount of thinner and spray pressure will depend on the specific type of spray equipment used.

In an embodiment where the brushing process is applied, step 220 may be performed by brushing HumiSeal Type 1A27 on the surface of the leadframe 110 with a small addition of Thinner 521. Uniformity of the coating will however be influenced by an operator's technique.

In summary, a lighting assembly is disclosed which includes a leadframe and at least one light-emitting diode (LED) element arranged on the leadframe. At least a portion of the leadframe is covered with a polyurethane coating arranged to electrically insulate the portion of the leadframe, and at least a portion of the polyurethane covered portion of the leadframe is further covered with a thermally conductive material. A method for manufacturing the lighting assembly is also disclosed.

According to embodiments of the invention, the leadframe may be sealed with a uniform, µm-scale polyurethane layer of mega-ohm insulation, which allows for quick heat dissipation by using high thermally conductive materials instead of dielectric low-thermal-conductive plastic. Advantageously, the uniformity of the polyurethane coating allows for increased coverage of the electrical insulation and thus improved reliability of the lighting assembly.

An additional advantage of the embodiments is that the resulting polyurethane coating is able to retain its shape and properties in the subsequent overmolding process which features a high pressure (up to 600 bar) and temperature (up to 320° C.). This facilitates the manufacturing of the lighting assembly by providing design flexibility in the overmolding process.

While the present invention has been illustrated and described in detail in the appended drawings and the foregoing description, such illustration and description are to be considered illustrative or exemplifying and not restrictive; the present invention is not limited to the disclosed embodiments. Other variations to the disclosed embodiments can be understood and effected by those skilled in the art in practicing the claimed invention, from a study of the drawings, the disclosure, and the appended claims. The mere fact that certain measures are recited in mutually different dependent claims does not indicate that a combination of these measures cannot be used to advantage. Any reference signs in the claims should not be construed as limiting the scope.

The invention claimed is:

1. A lighting assembly, comprising:
   a leadframe having at least a portion covered with a polyurethane coating that electrically insulates the portion of the leadframe, the leadframe further comprising a thermally conductive material at least partially covering the polyurethane coating to provide heat dissipation for the assembly; and
   at least one light-emitting diode(LED) element on the leadframe, configured to emit light when supplied with electrical power via the leadframe.

2. The lighting assembly according to claim 1, wherein the polyurethane coating covers an entire surface of the leadframe other than an area where the leadframe receives the electrical power therethrough.

3. The lighting assembly according to claim 2, wherein the thermally conductive material covers an entire surface of the polyurethane coating other than an area where the at least one LED element is arranged.

4. The lighting assembly according to claim 1, wherein the thermally conductive material has an in-plane thermal conductivity larger than or equal to 1 W/mK.

5. The lighting assembly according to claim 1, wherein the polyurethane coating has a thickness larger than or equal to 0.1 μm.

* * * * *